(12) United States Patent
Elmer et al.

(10) Patent No.: US 7,244,950 B2
(45) Date of Patent: Jul. 17, 2007

(54) TRIGGER PROBE FOR DETERMINING THE ORIENTATION OF THE POWER DISTRIBUTION OF AN ELECTRON BEAM

(75) Inventors: John W. Elmer, Danville, CA (US);
Todd A. Palmer, Livermore, CA (US);
Alan T. Teruya, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 273 days.

(21) Appl. No.: 11/158,481

(22) Filed: Jun. 21, 2005

(65) Prior Publication Data
US 2006/0038139 A1    Feb. 23, 2006

Related U.S. Application Data (60) Provisional application No. 60/582,754, filed on Jun. 24, 2004.

(51) Int. Cl.
*G01N 27/00* (2006.01)
(52) U.S. Cl. ..................... 250/397; 324/71.3
(58) Field of Classification Search ................ 250/397; 324/1.3
See application file for complete search history.

(56) References Cited

U.S. PATENT DOCUMENTS

| | | | |
|---|---|---|---|
| 5,382,895 A * | 1/1995 | Elmer et al. ............... | 324/71.3 |
| 5,468,966 A | 11/1995 | Elmer et al. | |
| 5,554,926 A | 9/1996 | Elmer et al. | |
| 5,583,427 A * | 12/1996 | Teruya et al. ............... | 250/397 |
| 6,300,755 B1 * | 10/2001 | Elmer et al. ............... | 324/71.3 |
| 2007/0015969 A1 * | 1/2007 | Feldman et al. ............ | 600/160 |

* cited by examiner

*Primary Examiner*—Nikita Wells
*Assistant Examiner*—Johnnie L Smith, II
(74) *Attorney, Agent, or Firm*—Michael C. Staggs; John H. Lee (57) ABSTRACT

The present invention relates to a probe for determining the orientation of electron beams being profiled. To accurately time the location of an electron beam, the probe is designed to accept electrons from only a narrowly defined area. The signal produced from the probe is then used as a timing or triggering fiducial for an operably coupled data acquisition system. Such an arrangement eliminates changes in slit geometry, an additional signal feedthrough in the wall of a welding chamber and a second timing or triggering channel on a data acquisition system. As a result, the present invention improves the accuracy of the resulting data by minimizing the adverse effects of current slit triggering methods so as to accurately reconstruct electron or ion beams.

15 Claims, 5 Drawing Sheets

TRIGGER PROBE FOR DETERMINING THE ORIENTATION OF THE POWER DISTRIBUTION OF AN ELECTRON BEAM

CROSS-REFERENCE TO RELATED APPLICATIONS

This application claims the benefit of U.S. Provisional Patent Application No. 60/582,754 filed Jun. 24, 2004 and titled "A Trigger Probe for Determining The Orientation of the Power Distribution of an Electron Beam" and is herein incorporated by reference in its entirety.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to beam profiling electron and/or ion beams, and more particularly to a trigger diagnostic and method for determining the orientation of profiled electron beams.

2. State of Technology

Many of the diagnostic methods for measuring the power density distribution in electron beams are variations of the Faraday cup. A version of the Faraday cup diagnostic method can include an electrically conductive trap, which contains and measures a beam current. In order to measure the power density distribution of the beam, modifications to the Faraday cup are required so that only a selected portion of the beam enters the cup at any one time. One type of Faraday cup isolates a portion of the beam by placing a single slit or knife-edge above the Faraday cup while the beam is swept over this slit. This technique measures the beam intensity along the sweep direction and provides a one-dimensional profile of the beam. By maximizing the amplitude of the profile measured through the slit while adjusting the focus, the minimum beam width, which corresponds to the sharpest focus along this direction, can be determined. This technique provides a one-dimensional view of the beam along the sweep direction and is useful for inspecting beams with radial symmetry; however, if the beam is non-circular or has an irregular power distribution, more sophisticated techniques are required to map the power density distribution in the beam.

Pinhole devices have also been used to measure the power distribution of irregularly shaped electron beams. Pinhole measurements are made using a small aperture (<10% of the beam diameter) placed over a Faraday cup. The electron beam sweeps over the pinhole several times at regularly spaced intervals to provide enough information to map the power density distribution in the beam. The drawbacks of this technique are that variations in the side-to-side position of the beam on successive sweeps can lead to errors in the measured power density distribution and that this device has a relatively low signal-to-noise ratio since the pinhole collects only a small percentage of the beam current.

Computed tomography (CT) coupled with a modified Faraday cup (MFC) technique was developed at Lawrence Livermore National Laboratory as an improvement to the above methods for measuring the power density distribution of electron beams used for welding. The Lawrence Livermore National Laboratory device includes a Faraday cup assembly within an electrically insulating ceramic cup, a tungsten disk containing 17 thin radially positioned slits (0.1 mm wide each), and a cylindrical copper heat sink that holds the tungsten disk above the Faraday cup. During operation, the electron beam deflection coils are used to sweep the beam in a circle of known diameter and at a constant frequency over the tungsten slit disk. The majority of the beam current is intercepted by the tungsten disk and is conducted by the copper heat sink to ground. However, when the beam passes over a slit, a portion of the beam current passes through the slit and into the Faraday cup where it can be measured as a voltage drop across a known resistor.

A current versus time profile is collected using a fast sampling analog to digital converter as the beam passes over each slit, wherein each slit provides a profile of the beam at an angle perpendicular to that slit. Such profiles are then compiled and tomographically reconstructed in order to determine the size, shape, and power density distribution of the beam. When defocused, the electron beams are asymmetric in both shape and power density distribution. The beam orientation is currently determined by the positioning of an oversized radial slit on the tungsten disk. Since this one slit is wider than the others, its profile is larger than the others and can be easily identified by the reconstruction software. However, such an oversized slit can adversely affect the reconstruction of the beam, especially in cases in which the width of this slit is no longer small relative to the width of the beam.

Background information for systems and methods of profiling power distributions within an electron beam can be found in U.S. Pat. Nos. 6,300,755, 5,468,966, 5,554,926, 5,382,895 and 5,583,427. Further background information on such diagnostic methods and devices is described by J. W. Elmer et al. in, "Tomographic Imaging of Non-Circular and Irregular Electron Beam Power Density Distributions," Welding Journal 72 (ii), p. 493-s, 1993; A. T. Teruya et al.; "Fast Method for measuring power-density distribution of non-circular and irregular electron beams," Science and Technology of Welding and Joining, 3(2):51 Elmer, J. W. and Teruya A. T.; "An Enhanced Faraday Cup for Rapid Determination of Power Density Distribution in Electron Beams," Welding Journal 80(12), pp. 288-s to 295-s, Elmer, J. W. and Teruya A. T.

Accordingly, there is a need for an improved method and system of identifying the orientation of ion /electron beams being profiled. The present invention is directed to such a need.

SUMMARY OF THE INVENTION

Accordingly, the present invention provides a method of profiling a beam that includes: sweeping a beam across a disk having a plurality of slits with the disk being arranged in a modified Faraday cup system, positioning a probe to detect secondary and backscattered electrons from a predetermined position on the disk; sensing a signal produced by the probe; calculating the proper orientation of the beam based on the signal so as to produce a beam profile; and processing data resulting from the beam profile so as to reconstruct the power distribution in the beam.

Another aspect of the present invention provides a beam profiling system that includes a probe that can detect secondary and backscattered electrons and an electronic circuit arranged to combine signals resulting from the probe and from the modified Faraday cup arrangement, wherein the power distribution from an energy beam can be accurately reconstructed.

The present invention provides an improved Faraday cup system that eliminates changes in slit geometry, an additional signal feedthrough in the wall of a welding chamber and a second timing or triggering channel on a data acquisition system. Accordingly, the present invention improves the accuracy of the resulting data by minimizing the adverse effects of current slit triggering methods so as to accurately reconstruct electron or ion beams.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

Referring now to the following detailed information, and to incorporated materials; a detailed description of the invention, including specific embodiments, is presented.

Unless otherwise indicated, numbers expressing quantities of ingredients, constituents, reaction conditions and so forth used in the specification and claims are to be understood as being modified by the term "about." Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical value, however, inherently contain certain errors necessarily resulting from the standard deviation found in their respective testing measurements.

General Description

The proposed concept is based on a configured external probe and circuit arranged in a system for tomographic determination of the power distribution of non-circular and irregularly (e.g., elliptical) shaped electron beams. Specifically, such a probe and circuit can be configured in existing Faraday cup embodiments to provide an improved method of orienting a measured beam profile with respect to a welding chamber. Similar systems and methods for determining the power distribution in electron beams can be found in U.S. Pat. No. 5,468,966, by Elmer et al., entitled "System For Tomographic Determination Of The Power Distribution in Electron Beams"; U.S. Pat. No. 5,583,427, by Teruya et al., entitled "Tomographic Determination Of The Power Distribution In Electron Beams"; U.S. Pat. No. 5,554,926, by Elmer et al., entitled "Modified Faraday Cup"; and U.S. Pat. No. 6,300,755, by Elmer et al., entitled "Enhanced Modified Faraday Cup For Determination Of Power Density Distribution Of Electron Beams"; all of which are herein incorporated by reference in its entirety.

Figure 1A:
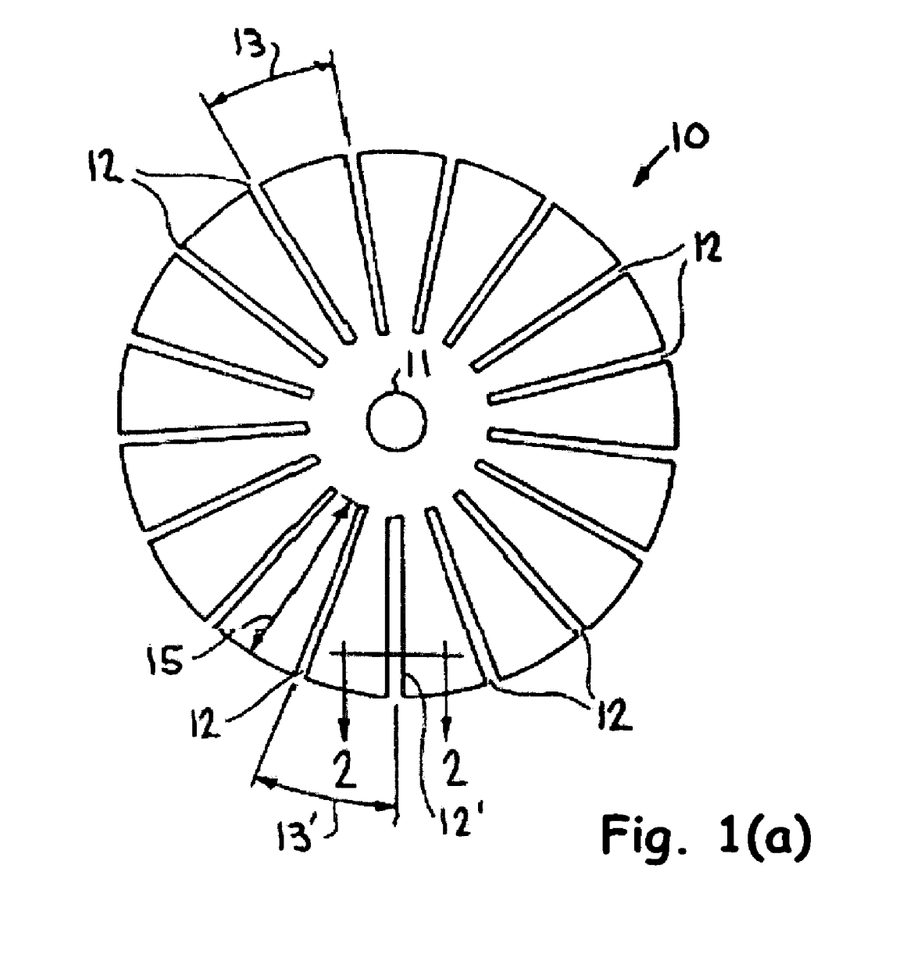
FIG. 1(a) shows a prior art refractory metal disk having radially extending slits, with one of the slits being twice as wide as the other slits.

FIG. 1(a) shows a refractory metal disk, as disclosed in incorporated by reference U.S. Pat. No. 6,300,755, and is generally designated by the reference numeral 10. Such a disk 10 is often constructed from tungsten, but may be constructed of tantalum, tungsten-rhenium, or other refractory metals and is configured with a center hole 11 and an odd number of radially extending slits spaced apart from center hole 11, with a predetermined slit 12' having an enlarged width that enables orientation of a beam profile with respect to the coordinates of a welding chamber. Disk 10 can be arranged to have a diameter of about 1.5 inches and a thickness of about 0.125 inches ±0.005 inches. Center hole 11 can be configured to have a diameter of about 0.040 inches ±0.002 inch and further configured to be about ±0.002 from the true center. Slits 12 in disk 10 can be equally spaced apart, such as, for example, at about 21.18°±0.02°, as indicated by double arrow 13, each having a width of about 0.004 inches ±0.002 inches on an upper surface 14 of disk 10 and a length of about 0.500 inches ±0.005 inches, as indicated by double arrow 15, wherein such slits 12 can terminate a distance of about 0.250 inches from true center hole 11.

Figure 1B:
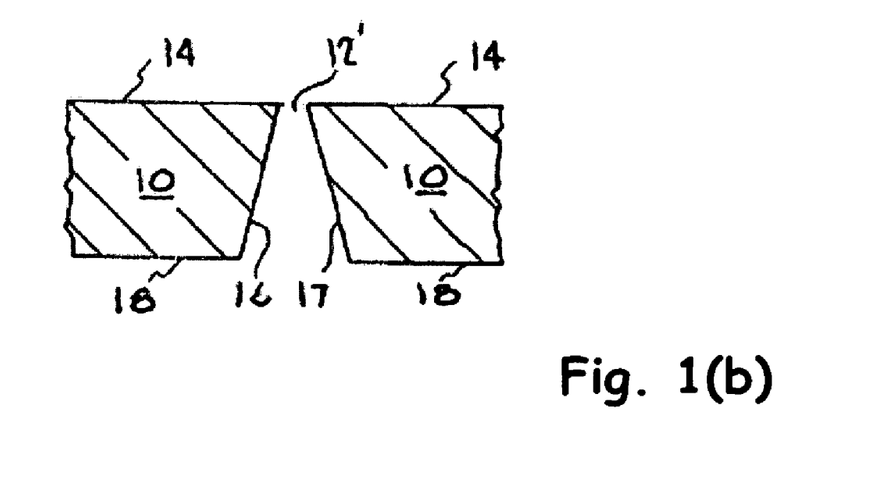
FIG. 1(b) illustrates a cross section of the prior art refractory metal disk.

FIG. 1(b) is a cross-section of a section of disk 10 and widened slit 12' looking radially outwardly in the direction of arrows 2-2 of FIG. 1(a), wherein the slit 12' has tapered surfaces 16 and 17 tapering outwardly and downwardly from upper surface 14 to a lower surface 18 of disk 10. The slits 12 and slit 12' are tapered, beveled, etc. to remove material from the disk 10 behind the slits in surface 14 of the disk to improve sensitivity and prevent beam reflections and/or secondary electrons, while providing adequate heat dissipation generated by the electron beam crossing slits 12 and 12'. The tapered surfaces 16 and 17 are exemplified as being at a 10° angle and can be increased or decreased by about 2-4 degrees.

While having a configured widened slit 12' is a beneficial embodiment, as shown in as shown in FIGS. 1(a)-1(b), such an arrangement can adversely affect the reconstruction of the beam, especially in cases in which the width of this slit is no longer small relative to the width of the beam. Therefore, the beam width of the reconstructed beam may be slightly elongated in cases of tightly focused beams as the width of the beam approaches that of an enlarged slit.

The present invention generally involves an improvement of previously disclosed systems and is substantially the same as that of above-incorporated by reference U.S. Pat. No. 6,300,755, except for a configured external probe to provide a fiducial locator (i.e., a timing or triggering signal) mounted in a modified flange clamp and a sensing circuit to detect such a fiducial locator so as to properly orient an ion or electron beam. The use of such an external electron probe eliminates the need for an enlarged slit, as shown in FIGS. 1(a)-1(b), by taking advantage of the secondary and backscattered electrons generated by the interaction between the beam and an integrated tungsten disk. Such a probe rests above the tungsten slit disk and is aimed at a point located between two of the slits so that the reconstructed beam profile can be determined with the proper orientation.

Specific Description

Figure 2:
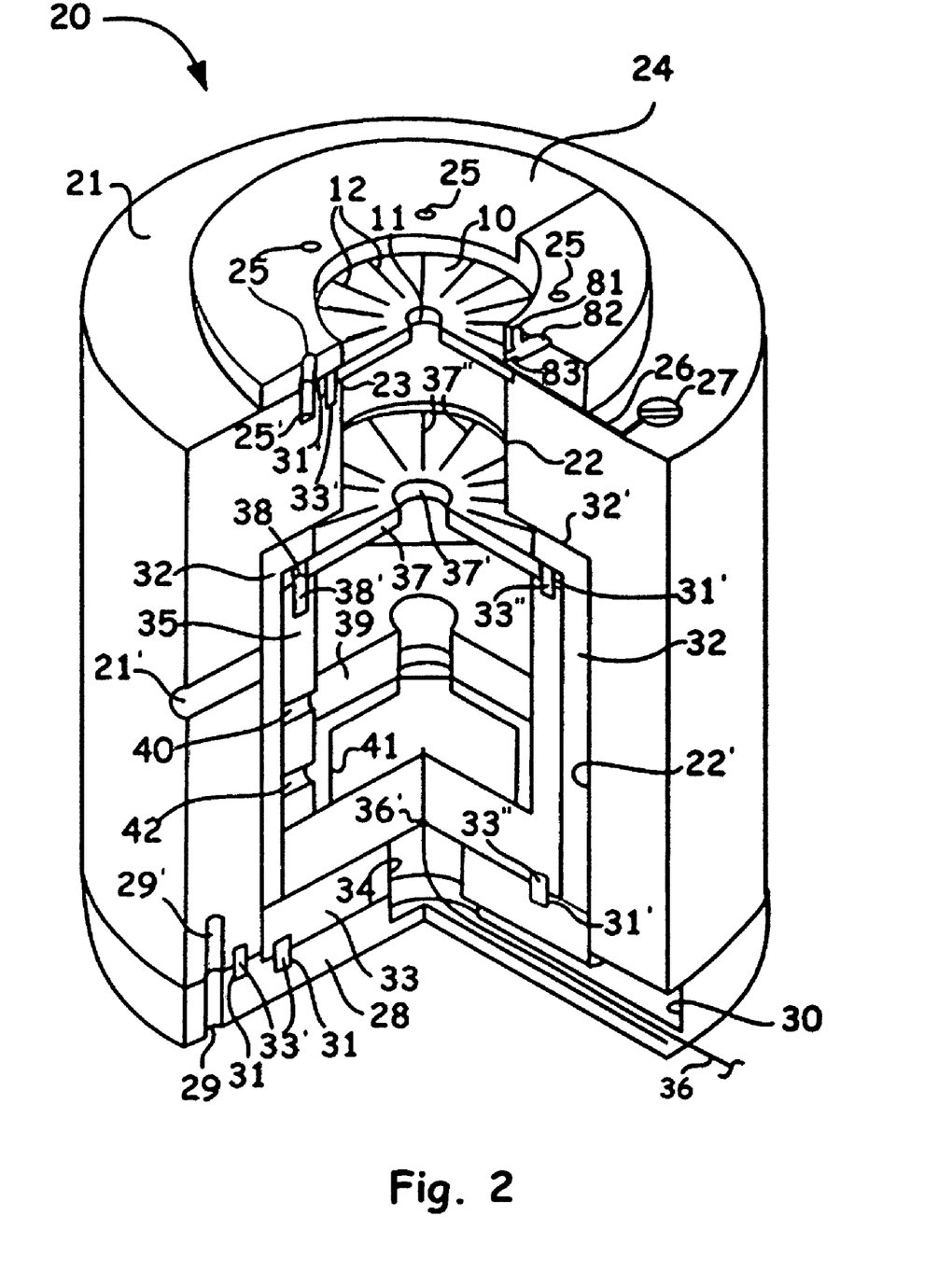
FIG. 2 shows a partial cross-section of an example enhanced modified Faraday cup of the present invention.

Turning back to the drawings, FIG. 2 shows a partial cross-section of an example enhanced MFC of the present invention, capable of being utilized in accordance with the present invention, and is generally designated by the reference numeral 20. MFC 20 includes an outer shield or heat sink body 21, made of high electrically conductive metal or alloy, such as copper, silver or steel, with an opening extending therethrough that includes sections 22 and 22', with opening section 22 being of a smaller diameter than opening section 22', and with a cutaway or counter-sink 23 about the outer end of opening section 22. Disk 10, arranged with, for example, an odd number of slits of equal width, can be manufactured from a beneficial slit refractory metal, such as, for example, tungsten and can be positioned in countersink 23 and secured in heat sink body 21 by a modified flange clamp or plate 24 made of copper, silver, or steel that is removably attached via bolts, screws, etc., arranged in a plurality of through holes 25 in plate 24 so as to be received by threaded opening 25' in heat sink body 21.

An electrical ground, such as a wire 26, made of, for example, tantalum, copper, or silver, is brazed or otherwise secured to the slit disk 10 and attached to the heat sink body 21 via any means known to those skilled in the art, such as, but not limited to, a screw 27. Outer shield or heat sink body 21 includes a lower plate section 28, also capable of being constructed of copper, silver, or steel and secured to heat sink body 21 by bolts or screws extending through openings, e.g., 29 and 29'. Plate section 28 includes a radially extending passageway or groove 30 and a cutaway or counter-sink 31. Positioned within opening section 22' of heat sink body 21 is a liner or insulator 32 that can be arranged from, for example, Macor ceramic, alumina, and boron nitride; and an annular bottom cap or plate 33 that can also be arranged from Macor ceramic, alumina, boron nitride, or any other insulator material capable of meeting the specifications of the present invention. Liner 32 may be secured by screws extending through opening 21' in heat sink body 21. The annular bottom cap or plate 33 includes a central opening 34 which aligns with groove 30 in plate section 28 and is provided with a protruding pin 33' that fits into cutaway 31. A Faraday cup 35, constructed of copper, silver, or steel, is located within liner 32 and abuts annular cap 33, and a signal wire 36, such as a shielded copper wire, is secured to the bottom of Faraday cup 35, as indicated at 36', and extends outwardly via opening 34 in cap 33 and groove 30 in plate section 28.

Positioning in the upper end of Faraday cup 35 is a second slit disk 37, constructed of copper, silver, tantalum, or tungsten having a center hole 37' and slits 37" which align with center hole 11 and slits 12-12' of disk 10. The second disk 37 can be secured to Faraday cup 35 by bolts, screws, etc. extending in, for example, openings 38 and 38' in disk 37 and the Faraday cup 35. Liner or insulator 32 includes an inwardly extending flange 32' which extends over the periphery of the second disk 37. Located within Faraday cup 35 and below the second disk 37 is a ring 39, constructed of graphite, copper, or tantalum, which is secured therein by bolts, screws, etc., which extend through openings 40 in Faraday cup 35, only one shown. Located in Faraday cup 35 below ring 39 is a beam trap 41, constructed of copper, silver, or steel, and secured in the Faraday cup 35 by bolts, screws, etc., extending through openings, e.g., 42, in Faraday cup 35. Faraday cup 35 is aligned with plate 33 by a cutaway/pin arrangement, indicated at 31'/33". The second slit disk 37 is aligned with Faraday cup 35 and the first slit disk 10 is aligned with heat sink body 21 via cutaway/pin arrangements 31'/33", as shown in FIG. 2. It is to be appreciated that a beneficial embodiment of the present invention is shown at the cutaway portion of modified flange 24 that includes a thru hole 82 for an inserted trigger or timing probe (not shown) held in place by, for example, a set screw (not shown) threaded into thru hole 81.

Figure 3A:
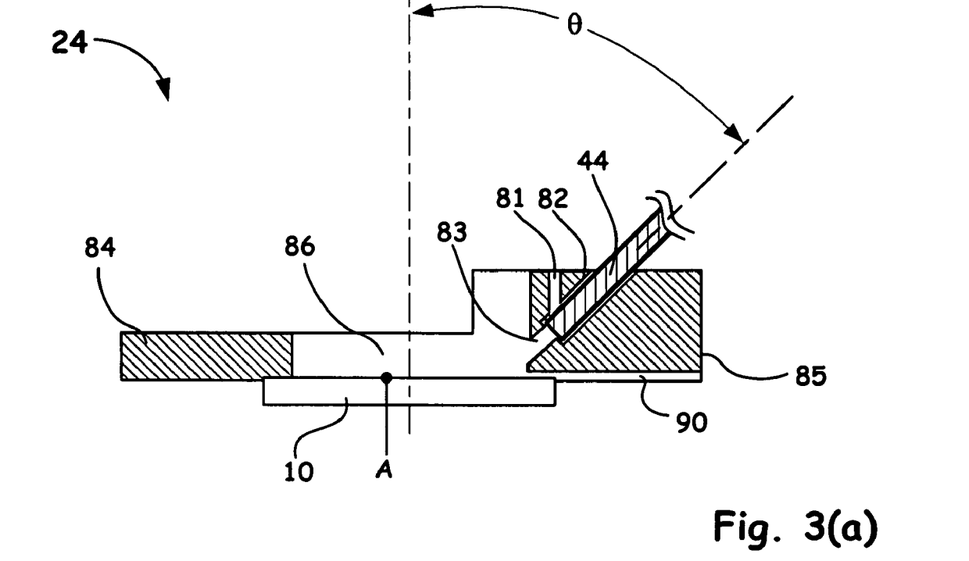
FIG. 3(a) shows a cross-sectional perspective of the modified flange clamp of the present invention.

FIG. 3(a) schematically illustrates a different cross-sectional perspective of modified flange clamp 24, as shown in FIG. 2, and as discussed above. Modified flange clamp 24 holds slit disk 10 to a fixed position and is also adapted to hold an external trigger or timing probe 44 of the present invention. In particular, modified flange clamp 24 is arranged with an outside diameter of about 3.0 inches so as to include a thin flange 84 region having a thickness of about 0.250 inches ±0.010 inches and a thicker flange region 85 of about 0.588 inches ±0.010 inches configured around a center hole region 86 having a diameter of about 1.250 inches ±0.005 inches.

Thicker flange region 85 can include a threaded hole 81 for receiving a predetermined fastener, such as a set screw (not shown) so as to affix external probe 44 disposed within thru hole 82. Thru hole 82, has been beneficially designed at a predetermined angle ($\theta$), such as, for example, an angle of about 45 degrees as measured from a center-line (C/L) of modified flange clamp 24 and is often further configured with a smaller diameter portion 83 that provides a stop and viewing aperture for probe 44. Such an arrangement provides a predetermined field of view for receiving backscattered/secondary electrons from disk 10, as stated above. Finally, thicker flange region 85 also includes a passageway or groove 90 for receiving wire 26, as shown in FIG. 2, to provide an electrical ground.

It is to be appreciated that the use of external probe 44, which often is a piece of a semi-rigid copper-jacketed coaxial cable, eliminates the need for a wide slit, as shown in FIGS. 1(a)-(b). Accordingly, by positioning probe 44 to be aimed at a point located between two predetermined slits located on disk 10 via modified flange clamp 24, probe 44 can beneficially detect secondary and backscattered electrons generated by the interaction between an ion or electron beam and disk 10.

Figure 3B:
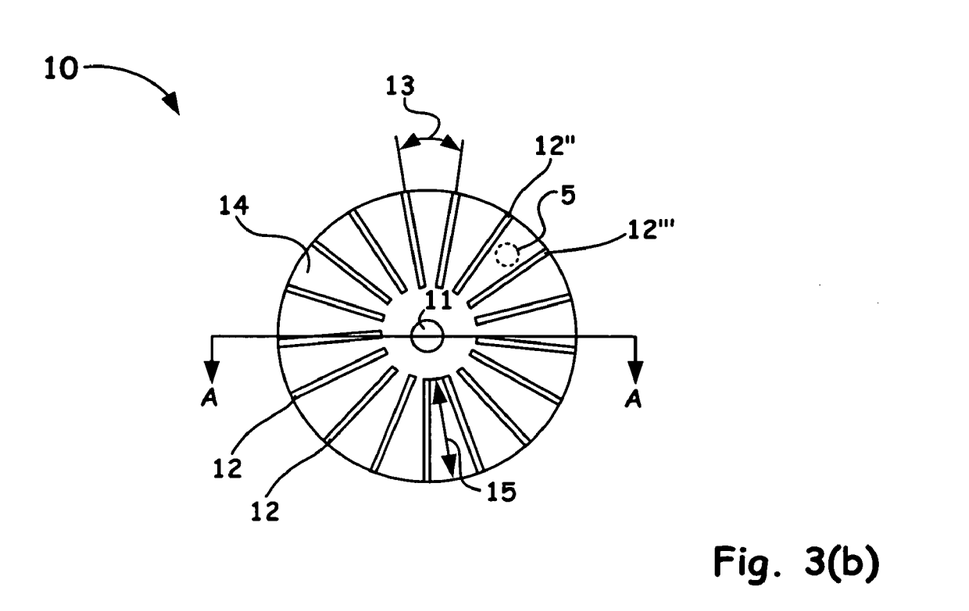
FIG. 3(b) shows a top-down perspective of a slit disk utilized with the modified flange clamp of the present invention.

FIG. 3(b) schematically shows a perspective of disk 10 looking top down in the direction of side A, as shown in FIG. 3(a). Such a perspective shows a predetermined point 5 (shown encircled for illustration purposes only) between a pair of predetermined slits (e.g., 12" and 12'''), as viewed by external probe 44 for receiving backscattered/secondary electrons so as to eliminate the need for a wide slit embodiment as illustrated in FIGS. 1(a)-(b). As the beam passes the probe locations, i.e., predetermined point 5, the secondary and back-scattered electrons, which originate from slit disk 10, are captured by the inner conductor of a coaxial cable that is utilized as probe 44. In order to limit the amount of electrons detected by probe 44, it is configured to accept electrons from only a narrowly defined area by first indenting the edge of the probe slightly below the surface of the modified flange clamp 24 via thru hole 82 and adding a small diameter portion 83, as stated above. Such features limit the locations from which electrons are scattered to those only directly in front of the probe. By placing probe 44 in such an arrangement, it does not interfere with the oscillation of the beam or the capture of the beam by the individual slits 12.

Disk 10, capable of being constructed from tantalum, tungsten-rhenium, or other refractory metals, is similar to the embodiment shown in FIGS. 1(a)-(b), except there is no longer the requirement for a wide slit to provide proper beam orientation. In the present invention, slits 12, often an odd number of radially extending slits 12, are spaced apart from center hole 11 and can be angularly spaced apart from other, for example, at about 21.18°±0.02°, as indicated by double arrow 13. Moreover, each slit 12, which terminates at distance of about 0.250 inches from true center hole 11, can be configured with a width of about 0.004 inches ±0.002 inches on an upper surface 14 of disk 10 and a length of about 0.500 inches ±0.005 inches, as indicated by double arrow 15. The sensing of scattered electrons by probe 44, produced as the beam passes between predetermined slits, e.g. slits 12" and 12''', of slit disk 10 can thus be used as a timing or triggering fiducial to orient the beam profile data, thus enabling the reconstruction software utilized in the present invention to calculate the correct orientation of the beam using beam profiles obtained by slits 12 having a uniform width.

Figure 4:
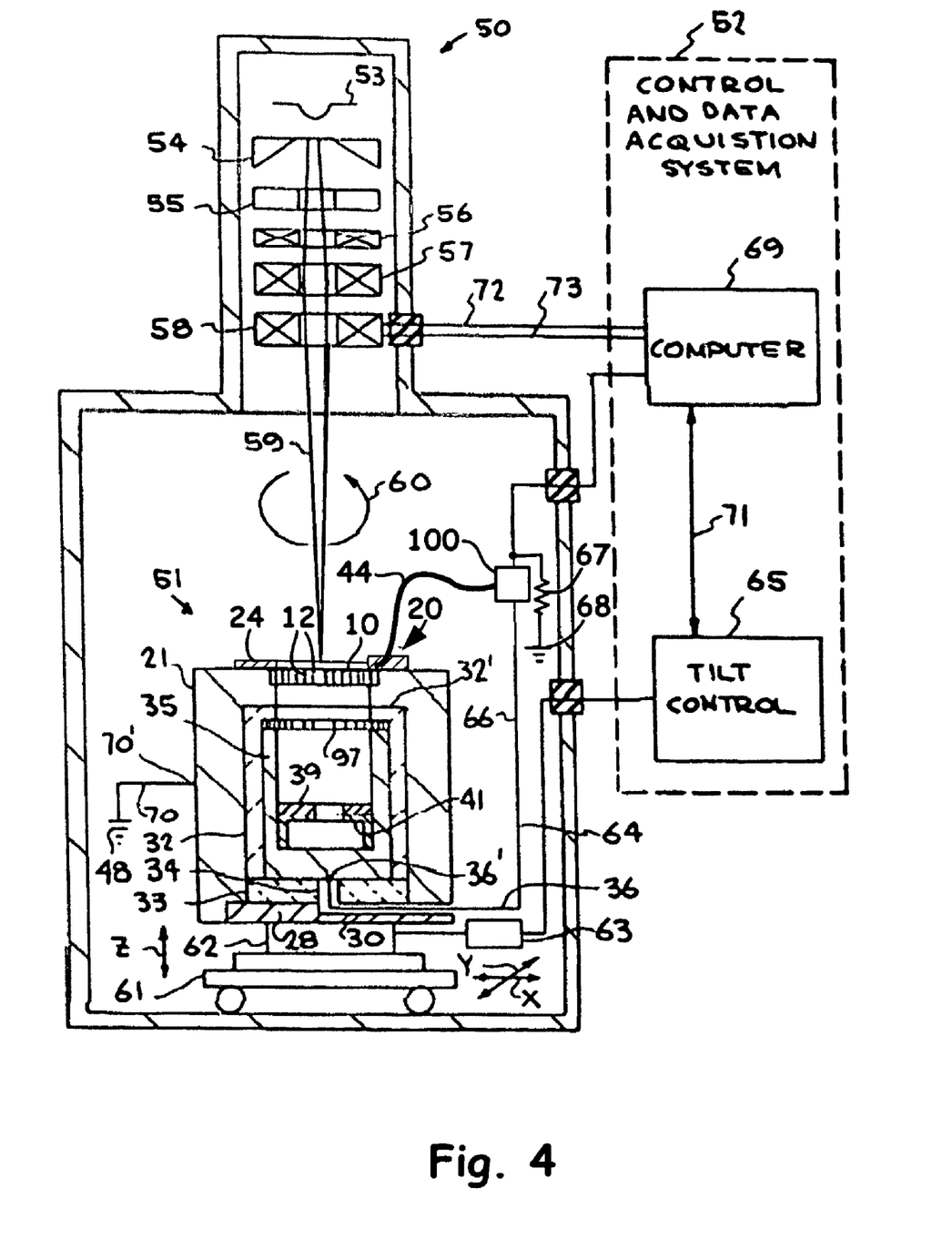
FIG. 4 shows an example system for determining the power density distribution in high power electron beams.

FIG. 4 schematically illustrates an example embodiment of the enhanced modified Faraday cup 20 illustrated in FIG. 2 and incorporating trigger or timing probe 44 arranged in modified flange 24, as shown in FIG. 3(a), in a system for taking electron beam profile data. The system of FIG. 4 involves three (3) interconnected components or sub-systems: an electron beam gun assembly generally indicated at 50, a modified Faraday cup (MFC) assembly generally indicated at 51, and a control and data acquisition system 52. System 52 functions to control elements of the gun assembly 50 and the MFC assembly 51 as well as storing the acquired data. The system of FIG. 4, as stated above, is substantially the same as that of above-incorporated by reference U.S. Pat. No. 6,300,755, except for probe 44, an electronic circuit 100 capable of converting probe signals to positive values and operably coupled to probe 44, modified flange clamp 24, and slit 10 having slits 12 of about the same width.

The electronic signal produced by trigger probe 44 is transmitted through the same circuit, e.g., circuit 100, as the beam profiles obtained by the slits. Because an electron beam is being collected, the voltages obtained by the data acquisition system have a negative value when passed across the current viewing resistor. In order for both the triggering signal and the beam profile signals to be transmitted on the same circuit without interference, the signal from the trigger probe is converted into a positive voltage through the addition of electronic circuit 100, which can be placed inside the electron beam vacuum chamber as shown in FIG. 4. However, while placing circuit 100 within the vaccum chamber is a beneficial arrangement, such a circuit can also be placed external to the vaccum chamber without departing from the scope and spirit of the present invention. In addition to the probe, a second beneficial component to the invention includes an electronic circuit operably connected to signals produced by the Faraday cup and to probe 44.

Figure 5A:
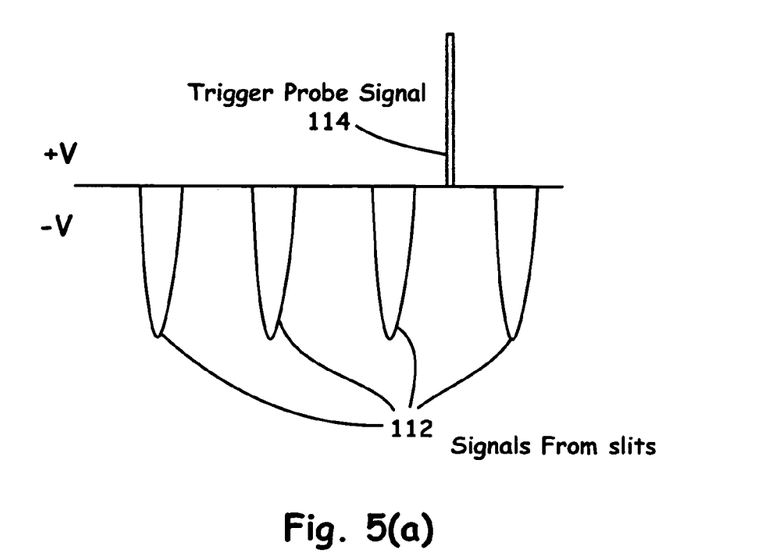
FIG. 5(a) shows example signals obtained by the data acquisition system of the present invention and illustrates the conversion of a signal from the trigger probe to a positive value.

FIG. 5(a) schematically illustrates example slit signals 112 and trigger probe signals 114 converted into a positive value. Because a positive voltage cannot be part of the beam profile data, the reconstruction software of the present invention ignores it while calculating the beam power distribution. The software thus utilizes the timing of trigger probe signal 114 to match the beam profiles to the orientation of the slit disk and to determine the proper beam orientation.

The addition of electronic converter circuit 100, as shown in FIG. 4, in the electron beam vacuum chamber or adapted external to the vacuum beam chamber, eliminates the need for a second feed-through, thus simplifying machine setup. In order for such a circuit 100 to function, it must be able to accept the signals from both the electron trigger probe and the slits, while at the same time converting the signal from the trigger probe and leaving the signals from the slits unchanged.

Figure 5B:
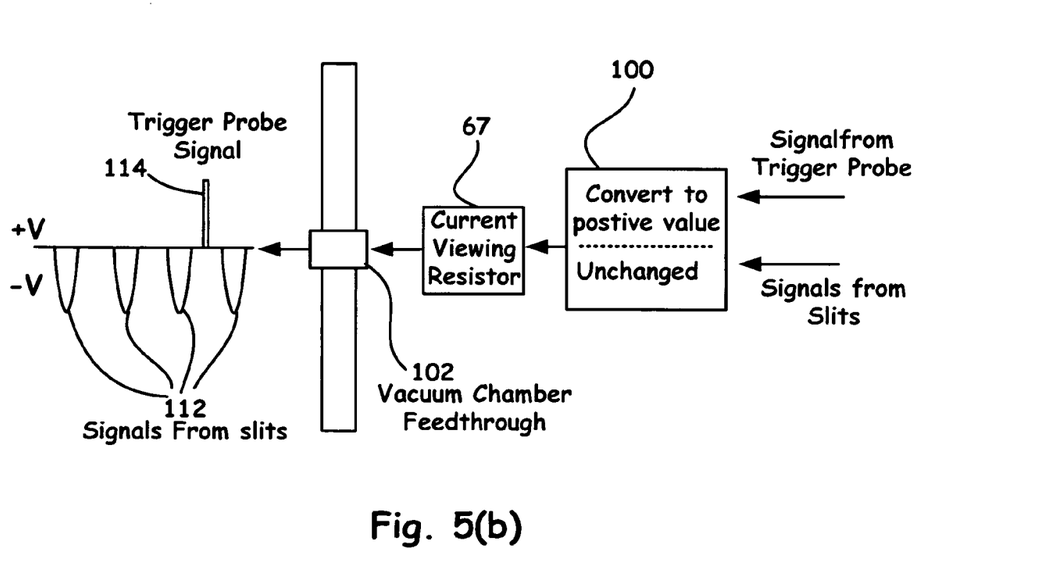
FIG. 5(b) shows a flow chart path of both signals from the vacuum chamber to the data acquisition system and the general location of the electronic circuit used to convert the trigger probe signal.

FIG. 5(b) shows a flow chart of the path of the signals from both the trigger probe 114 and the slits 112. Each signal, once obtained by the trigger probe or the slits, is transmitted to electronic circuit 100, which converts the trigger probe signal into a positive value. The two input signals can then be joined within electronic circuitry 100 in order for the signal to be transmitted through the single feed through 102 of the vacuum chamber. As the signal passes through current viewing resistor 67 (mounted internal or external to the vacuum chamber), the current is converted to a voltage, with the slits displaying negative voltage signals 112 and the trigger probe displaying a positive voltage signal 114.

Turning back to FIG. 4, electron beam gun assembly 50, such as may be used in a welding machine, basically includes a filament 53, a cathode 54, an anode 55, an alignment coil 56, a magnetic lens 5, and a deflection coil 58. Filament 53 may be of any desired configuration, such as a ribbon type or a hairpin type as known in the art. The various components of electron beam gun assembly 50, and details of filament 53 are known in the art. The deflection coil 58 is connected so as to be controlled by system 52 to deflect an electron beam produced by gun assembly 50 and indicated at 59 in a circular pattern as indicated by arrow 60. Beam 59 is thus moved via deflection coil 18 to sweep across each of the slits 12 and 12' in slit disk 10 in the enhanced MFC 20 of the MFC assembly 51 as the beam 59 is deflected in a circular pattern as indicated by arrow 60.

Enhanced MFC 20, such as the embodiment illustrated in detail in FIG. 2, can be mounted on a movable assembly 61, via a support member 62 and an actuator 63 connected via line 64 to a tilt controller 65 of control and data acquisition system 52. Movable assembly 61, that includes x, y, and z translation stages as indicated by the double arrows x, y, and z, provides the capability of movement of enhanced MFC 20 as desired to accurately align slits 12 of slit disk 10 with the electron beam 59 as it moves in a circular pattern around the disk 1, as discussed in greater detail hereinafter. The electrical contact 36, as shown in FIG. 2, of MFC 20 is connected via an electrical cable or lead 66 to a current viewing or sensing resistor 67 and to a common ground as indicated at 68, and to a computer 69 of system 52. As another arrangement, signal wire 36 can be replaced by a coaxial-type electrical cable and connector as detailed in above-incorporated by reference U.S. Pat. No. 6,300,755. The voltage across resistor 67 is measured and stored in computer 69 for each probe signal 114 and each slit signal 112, as shown in FIGS. 5(a) and 5(b), as beam 59 passes thereacross. Housing 21 of MFC 20 is electrically connected to the common ground 48 via a cable or lead 70 connected to electrical contact 70'. By way of example, the resistor 67 may be 100 ohms.

The control and data acquisition system 52 includes computer 69 and tilt controller 65, with computer 69 being connected to tilt controller 65 via a cable or lead 71 and to deflection coils 58 of electron gun 50 via leads or cables 72 and 73. To accurately position the MFC 20 with respect to the sweep of the electron beam 59 across the slits 12 of disk 10, the computer 69 through tilt controller 65 actuates actuator 63 to move the movable assembly 61 in any desired direction. To initiate acquisition of beam profile data via MFC 20, electron gun 50 is turned on and computer 69 activates deflection coils 58 of electron gun 50 to move the beam 59 in a circular pattern so as to cross each slit 12 of disk 10, and thereafter computer 69 receives the output data from MFC 20 via lead 66 and resistor 47. Thus, a single computer is used to generate the signals actuating the electron beam sweep, to acquire the data from the MFC, and to do the reconstruction of the beam profile data to produce a tomographic profile of the power distribution in the electron beam.

Because each of the angular profiles is acquired using a different slit 12 in slit disk 10, it is important that the slit disk be accurately centered on and made perpendicular to an undetected beam. In order to facilitate this, small hole 11 has been drilled in the center of the slit disk, which allows the modified Faraday cup of the present invention to be used as a traditional Faraday cup and measure the total beam current. Disk 10 may then be centered on beam 59 by moving the MFC 20 around, via movable assembly 61, until a signal read across sensing resistor 67 indicates that the center hole 11 is aligned with beam 59. If slit disk 10 is tilted and slits 12 are not perpendicular to the beam, then the beam path through some of the slits 12 will be narrowed or cut off completely since slit disk 10 has a thickness that is much larger than the width of the slits. Tilt of the MFC 20 is checked by sweeping beam 59 in its circular pattern, indicated by arrow 60, and adjusting the tilt via tilt controller 65, or manually adjusted, and assembly 61 until a clear signal comes through each slit.

The problem of sensitivity to tilt may be minimized by removing material behind the top surface forming the slits so that only material at the top surface 14 of the slit disk 10 forms the slits 12 while remembering that it is important to provide as much disk material possible to adequately dissipate heat generated by the electron beam. Although the walls of the slits can be parallel so as not to have a tapered configuration, tapering the walls of the slits so that the walls are not perpendicular to the front or top surface 14 of slit disk 10, as shown in FIG. 1(*b*), can also be utilized to resolve tilt sensitivity. With respect to the second slit disk, the slits must be large enough to let all electrons pass through. As another arrangement, such wall surfaces can also be leveled or otherwise configured such that the bottom of the slits is wider than the width of the slits at the top surface 14 of disk 10.

Electron beam welds are made by first determining the "sharp focus" condition, which is used as a reference point, and then setting the welding focus above, below, or directly on this sharp focus to produce the desired weld properties. Without the use of diagnostic tools, the sharp focus condition is somewhat subjective and is generally determined by the electron beam operator. By use of computer tomography (CT), such as described in above-referenced U.S. Pat. No. 5,583,427 and by using trigger or timing probe 44 and electronic circuit 100, as shown in FIGS. 3(*a*) and 4 respectively, a power density distribution can be measured as a function of focus coil setting for electron beams at about 80 kV and 1 about 40 kV generated by, for example, a 150 kV, 50 mA Hamilton-Standard electron beam welder, fitted with a ribbon filament and an R-40 electron gun.

The present invention provides an enhanced method and system for use in a system for tomographically determining the power distribution in electron beams. Accordingly, the present invention can be utilized with high-power, high-intensity multiple kilowatt (20 kv plus) electron beams, or with low-power (1 kv) beams in addition to analysis of ion beams. Moreover, the present invention can be utilized for the analysis of any type of energy producing beams such as the generation of x-rays or use in electron beam lithography.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A method of profiling a beam of energy, comprising:
sweeping a beam across a disk having a plurality of slits, said disk being arranged in a modified Faraday cup system,
positioning a probe to detect secondary and backscattered electrons from a predetermined position on said disk;
sensing a signal produced by said probe;
calculating the proper orientation of said beam based on said signal so as to produce a beam profile; and
processing data resulting from said beam profile so as to reconstruct the power distribution in said beam.

2. The method of claim 1, further comprising fixidly arranging said probe above said disk.

3. The method of claim 1, wherein said probe comprises a copper-jacketed coaxial cable, wherein an inner conductor of said coaxial cable is configured to capture a plurality of electrons so as to provide said signal.

4. The method of claim 1, wherein said secondary and backscattered electrons are detected via a predetermined field of view.

5. The method of claim 1, wherein said sensing step further comprises an electronic circuit integrated into a data acquisition hardware arrangement.

6. The method of claim 5, wherein said electronic circuit is capable of converting said signal into a positive value and leaving a plurality of slit produced signals unchanged.

7. The method of claim 5, wherein said electronic circuit can be arranged internal or external of said Faraday cup system to allow a single feedthrough.

8. The method of claim 1, wherein processing comprises computer tomography.

9. An enhanced modified Faraday cup system, comprising:
a Faraday cup;
a disk configured above said Faraday cup, said disk having a central opening and a plurality of radially extending slits therein;
a probe configured so as to detect secondary and backscattered electrons from said disk;
an electronic circuit arranged to combine signals resulting from said trigger probe and predetermined signals resulting from said Faraday cup; and
a data acquisition system arranged to process said probe signals and said Faraday cup signals, wherein the power distribution from an energy beam can be accurately reconstructed.

10. The system of claim 9, wherein said probe is fixidly adapted above said disk.

11. The system of claim 9, wherein said disk comprises a metal.

12. The system of claim 9, wherein said probe comprises a copper-jacketed coaxial cable, wherein an inner conductor of said coaxial cable is configured to capture a plurality of electrons so as to provide a timing signal.

13. The system of claim 9, wherein said secondary and backscattered electrons are detected via a predetermined field of view.

14. The system of claim 9, wherein said electronic circuit converts a signal produced by said probe into positive values and leaves a plurality of slit produced signals unchanged.

15. The system of claim 9, wherein said electronic circuit can be arranged internal or external of said Faraday cup system so as to allow a single feedthrough.

* * * * *